US006753258B1

(12) United States Patent
Gaillard et al.

(10) Patent No.: US 6,753,258 B1
(45) Date of Patent: Jun. 22, 2004

(54) INTEGRATION SCHEME FOR DUAL DAMASCENE STRUCTURE

(75) Inventors: Frederic Gaillard, Voiron (FR); Li-Qun Xia, Santa Clara, CA (US); Ellie Yieh, San Jose, CA (US); Paul Fisher, Los Altos, CA (US); Margaret Gotuaco, San Francisco, CA (US)

(73) Assignee: Applied Materials Inc., Santa Clara, CA (US)

( * ) Notice: Subject to any disclaimer, the term of this patent is extended or adjusted under 35 U.S.C. 154(b) by 470 days.

(21) Appl. No.: 09/706,298

(22) Filed: Nov. 3, 2000

(51) Int. Cl.[7] ............................................. H01L 21/302
(52) U.S. Cl. ...................... 438/691; 438/692; 438/693; 438/706
(58) Field of Search ................................ 438/690, 691, 438/692, 706, 710, 712, 720, 745; 216/58, 67

(56) References Cited

U.S. PATENT DOCUMENTS

| | | | |
|---|---|---|---|
| 5,000,113 A | 3/1991 | Wang et al. ................. 118/723 |
| 5,354,712 A | 10/1994 | Ho et al. ..................... 437/195 |
| 5,554,570 A | 9/1996 | Maeda et al. ................. 437/235 |
| 5,703,404 A | 12/1997 | Matsuura ..................... 257/758 |
| 5,789,319 A | 8/1998 | Havemann et al. .......... 438/668 |
| 5,834,845 A | * 11/1998 | Stolmeijer ................... 257/752 |
| 5,843,847 A | 12/1998 | Pu et al. ...................... 438/723 |
| 5,854,131 A | * 12/1998 | Dawson et al. ............. 438/666 |
| 6,054,379 A | * 4/2000 | Yau et al. .................... 438/623 |
| 6,113,771 A | 9/2000 | Landau et al. .............. 205/123 |
| 6,153,833 A | * 11/2000 | Dawson et al. ............. 174/255 |
| 6,211,092 B1 | * 4/2001 | Tang et al. .................. 438/719 |
| 6,225,207 B1 | * 5/2001 | Parikh ......................... 438/622 |
| 6,252,290 B1 | * 6/2001 | Quek et al. ................. 257/522 |
| 6,291,334 B1 | * 9/2001 | Somekh ....................... 438/620 |
| 6,303,525 B1 | * 10/2001 | Annapragada .............. 438/782 |
| 6,323,067 B1 | * 11/2001 | Ning ............................. 438/132 |
| 6,329,118 B1 | 12/2001 | Hussein et al. ............ 430/270.1 |
| 6,340,435 B1 | * 1/2002 | Bjorkman et al. ............. 216/72 |
| 6,365,529 B1 | 4/2002 | Hussein et al. .............. 438/780 |
| 6,413,852 B1 | 7/2002 | Grill et al. ................... 438/619 |
| 6,417,112 B1 | * 7/2002 | Peyne et al. ................. 438/754 |
| 6,515,343 B1 | * 2/2003 | Shroff et al. ................. 257/530 |
| 6,627,539 B1 | * 9/2003 | Zhao et al. .................. 438/638 |
| 2001/0036748 A1 | 11/2001 | Rutter, Jr., et al. .......... 438/745 |

FOREIGN PATENT DOCUMENTS

EP    0 905 565 A1    3/1999    ............ G03F/7/09

OTHER PUBLICATIONS

Hussein, et al., "A Novel Approach To Dual Damascene Patterning," Jun. 2002, pp. 18–21, 2002 Proceeding of an LLIC of IEEE.

Hussein, et al., "A Novel Approach To Dual Damascene Patterning," 2002, pp. 1–28, Intel IITC–2002.

U.S. patent application Ser. No. 09/329,012, Bjorkman et al., filed Jun. 9, 1999.

U.S. patent application Ser. No. 09/247,381, Cheung et al., filed Feb. 10, 1999.

U.S. patent application Ser. No. 09/165,248, Pathi et al., filed Oct. 1, 1998.

* cited by examiner

*Primary Examiner*—Lan Vinh
(74) *Attorney, Agent, or Firm*—Moser, Patterson & Sheridan

(57) ABSTRACT

A method and apparatus for processing a substrate to form a feature in low k dielectric materials. One aspect of the invention provides a method for processing a substrate including forming a feature definition in a dielectric material deposited on a surface of a substrate, depositing one or more conductive materials to fill at least a portion of the feature definition, planarizing the substrate surface to expose the dielectric material, removing at least a portion of the dielectric material, and depositing a low k dielectric material.

60 Claims, 5 Drawing Sheets

INTEGRATION SCHEME FOR DUAL DAMASCENE STRUCTURE

BACKGROUND OF INVENTION

1. Field of the Invention

The present invention relates to the fabrication of integrated circuits and to a process and apparatus for forming semiconductor devices on a substrate.

2. Background of the Related Art

Consistent and fairly predictable improvement in integrated circuit (IC) design and fabrication has been observed in the last decade. One key to successful improvements in IC design and fabrication is the multilevel interconnect technology which provides the conductive paths in an IC device. The shrinking dimensions of conductive or semiconductive substrate features such as horizontal lines and vertical contacts, vias, or interconnects, in very large scale integration (VLSI) and ultra large scale integration (ULSI) technology, has increased the importance of improving the current density of semiconductor devices.

In order to further improve the current density of semiconductor devices on integrated circuits, it has become necessary to use conductive materials having low resistivity and low dielectric constant (low k) materials (defined herein as having dielectric constants, k, less than about 4.0) as insulating layers to reduce the capacitive coupling between adjacent interconnects. Increased capacitative coupling between layers can detrimentally affect the functioning of semiconductor devices.

However, typical low k dielectric materials are generally porous and generally require a barrier layer to prevent interlayer diffusion of materials into the low k dielectric materials. The barrier layer comprises conventional barrier materials, such as silicon oxide and silicon nitride, that have dielectric constants greater than 4.0 and often greater than 7.0. The resulting insulator stack of low k dielectric materials and conventional barrier materials may have a dielectric constant that is not much below 6.0 which minimizes the use of low k dielectric materials as intermetal dielectric layers.

Copper is also being used to improve the current density of semiconductor devices. Copper (Cu) is becoming the interconnect material of choice because of copper's low resistivity (1.7 $\mu\Omega$-cm) and high current carrying capacity. However, copper diffuses more readily into surrounding materials and can alter the electronic device characteristics of the adjacent layers and, for example, form a conductive path between layers, thereby reducing the reliability of the overall circuit and may even result in device failure.

One additional difficulty in using copper in semiconductor devices is that copper is difficult to etch and achieving precise pattern etching with copper using traditional deposition/etch processes for forming interconnects has been less than satisfactory. Further, the etch processes of low k materials, such as silicon carbide (SiC) and carbon doped silicon oxides, have not been well quantified and qualified in the art Thus, the combination of low k materials and copper has led to new deposition methods for preparing semiconductor features, such as vertical and horizontal interconnects, since copper is not easily etched to form metal lines. One method is the damascene or dual damascene methods depositing vertical and horizontal interconnects, wherein one or more dielectric materials are deposited and pattern etched to form the vertical and horizontal interconnects. Conductive materials, such as copper and other metals, are then inlaid into the etched pattern and any excess metal is removed from the top of the structure in a planarization process, such as chemical mechanical polishing (CMP).

However, low k dielectric materials often have a less than desirable hardness. Hardness is defined herein as a stability of a material during processing for retention of its shape or form. If low k dielectric materials disposed adjacent the dual damascene structure lacks sufficient hardness, the dual damascene structures may be imprecisely formed and can deform during latter processing of the substrate. For example, CMP can exert force against the dielectric material disposed on the substrate surface, which can distort the dielectric material, and in some cases result in delamination of the dielectric material from the substrate. Also, the low k dielectric materials are porous and processing, such as chemical mechanical polishing, can compress the porous dielectric material and increase the k value.

Additionally, it has been observed that dual damascene structures formed in low k materials have greater mechanical stresses than structures formed in traditional dielectric materials. Greater mechanical stresses can lead to imprecise formation of the dual damascene structure and increased deformation of the dual damascene structure during processing. Deformation or malformation of the dual damascene structures can detrimentally affect the performance of semiconductor devices.

Therefore, there is a need for an improved process for forming dual damascene structures with low k dielectric material. Ideally the low k dual damascene structure has good hardness and can be formed without the presence of barrier layers or etch-stops.

SUMMARY OF THE INVENTION

The invention generally relates to a method and apparatus for processing a substrate to form a feature in low k dielectric materials. One aspect of the invention provides a method for forming a feature in a low k dielectric material including forming a feature definition in a dielectric material deposited on a surface of a substrate, depositing one or more conductive materials to fill at least a portion of the feature definition, planarizing the substrate surface to expose the dielectric material, removing at least a portion of the dielectric material, and depositing a low k dielectric material.

Another aspect of the invention provides a method for forming a dual damascene interconnect comprising depositing one or more dielectric layers on a substrate, etching the one or more dielectric layers to form the dual damascene definition, the dual damascene definition having a vertical and a horizontal interconnect, depositing a conductive barrier layer over the exposed services of a dual damascene definition, depositing a conductive material over the conductive barrier layer to fill at least a portion of the dual damascene definition, planarizing the filled dual damascene definition to expose the one or more dielectric layers, removing at least a portion of the one or more dielectric layers, depositing a low k dielectric material, and depositing a self-planarizing dielectric material on the low k dielectric layer.

Another aspect of the invention provides a method for forming a dual damascene interconnect, comprising depositing a first dielectric material, depositing a second dielectric material on the first dielectric material, etching the second dielectric layer to exposed a portion of the first dielectric layer, depositing a third dielectric layer on the second dielectric material and exposed portion of the first dielectric layer, etching the first and third dielectric layers to form a vertical interconnect and a horizontal interconnect of a dual damascene definition, depositing a conductive barrier layer over exposed surfaces of the dual damascene definition, depositing a conductive material over the conductive barrier layer to fill at least a portion of the dual damascene definition, planarizing the filled dual damascene definition to expose the one or more dielectric layers, removing the one or more dielectric layers, depositing a low k dielectric material on the substrate, and depositing a self-planarizing dielectric layer on the low k dielectric material.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

The invention will be described below in reference to forming a feature in low k dielectric material. Generally, the method includes forming a feature in a dielectric material deposited on a surface of a substrate, removing at least a portion of the deposited dielectric material, and depositing a low k dielectric material, preferably as a gap fill, on the substrate surface.

The dielectric material and low dielectric material are preferably deposited by chemical vapor deposition. A suitable chemical vapor deposition plasma chamber for depositing dielectric materials is a DxZ™ CVD chamber commercially available for Applied Material, Inc., located in Santa Clara, Calif. The DxZ™ CVD chamber can be included on integrated platform such as the Endura™ platform available from Applied. Materials, Inc. located in Santa Clara, Calif. The deposition of dielectric materials may occur in a variety of chambers and the DxZ™ chamber described herein is provided for illustrative purposes, and should not be so construed or interpreted as to limit the scope of the invention.

Figure 1:
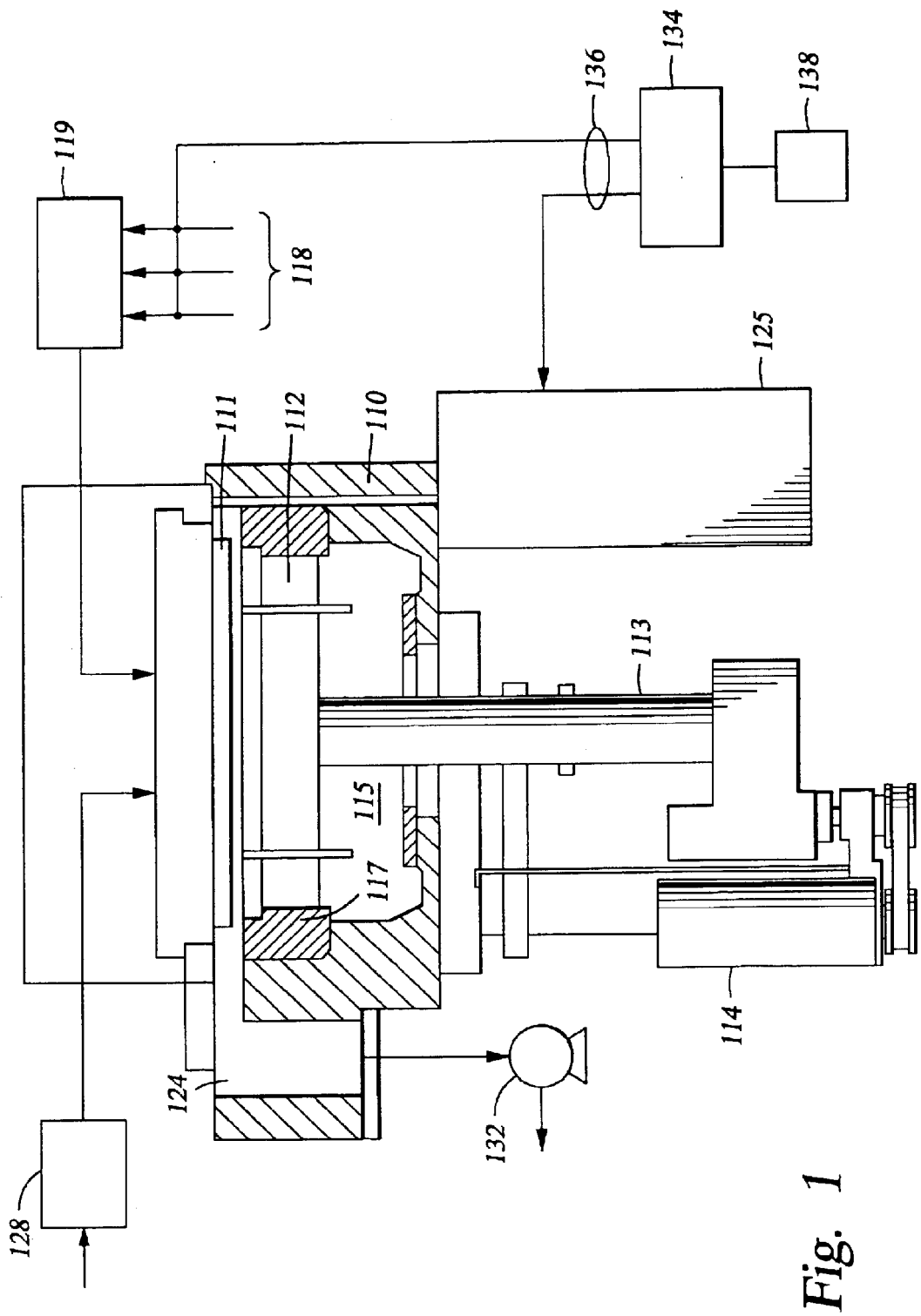
FIG. 1 is a cross sectional diagram of one embodiment of an exemplary chemical vapor deposition (CVD) chamber for performing one or more processing steps described herein.

FIG. 1 shows a vertical, cross-section view of a parallel plate chemical vapor deposition reactor 110 having a high vacuum region 115. The reactor 110 contains a gas distribution manifold 111 for dispersing process gases through perforated holes in the manifold to a substrate or substrate (not shown) that rests on a substrate support plate or susceptor 112 which is raised or lowered by a lift motor 114. A liquid injection system (not shown), such as typically used for liquid injection of TEOS, may also be provided for injecting a liquid organosilicon compound.

The reactor 110 includes heating of the process gases and substrate, such as by resistive heating coils (not shown) or external lamps (not shown). Referring to FIG. 1, susceptor 112 is mounted on a support stem 113 so that susceptor 112 (and the substrate supported on the upper surface of susceptor 112) can be controllably moved between a lower loading/off-loading position and an upper processing position which is closely adjacent to manifold 111.

When susceptor 112 and the substrate are in processing position 114, they are surrounded by a an insulator 117 and process gases exhaust into a manifold 124. During processing, gases inlet to manifold 111 are uniformly distributed radically across the surface of the substrate. A vacuum pump 132 having a throttle valve controls the exhaust rate of gases from the chamber.

Before reaching manifold 111, deposition and carrier gases are input through gas lines 118 into a mixing system 119 where they are combined and then sent to manifold 111. Generally, the process gases supply line 118 for each of the process gases also includes (i) safety shut-off valves (not shown) that can be used to automatically or manually shut off the flow of process gas into the chamber, and (ii) mass flow controllers (also not shown) that measure the flow of gas through the gas supply lines. When toxic gases are used in the process, several safety shut-off valves are positioned on each gas supply line in conventional configurations.

The deposition process performed in reactor 110 can be either a thermal process or a plasma enhanced process. In a plasma process, a controlled plasma is typically formed adjacent to the substrate by RF energy applied to distribution manifold 111 from RF power supply 125 (with susceptor 112 grounded). Alternatively, RF power can be provided to the susceptor 112 or RF power can be provided to different components at different frequencies. RF power supply 125 can supply either single or mixed frequency RF power to enhance the decomposition of reactive species introduced into the high vacuum region 115. A mixed frequency RF power supply typically supplies power at a high RF frequency (RF1) of 13.56 MHz to the distribution manifold 111 and at a low RF frequency (RF2) of 360 KHz to the susceptor 112. The silicon oxide layers of the present invention are most preferably produced using low levels of constant high frequency RF power or pulsed levels of high frequency RF power.

When additional dissociation of the oxidizing gas is desired, an optional microwave chamber 128 can be used to input from between about 0 Watts and about 6000 Watts of microwave power to the oxidizing gas prior to entering the deposition chamber. Separate addition of microwave power would avoid excessive dissociation of the organosilicon compounds prior to reaction with the oxidizing gas. A gas distribution plate having separate passages for the organosilicon compound and the oxidizing gas is preferred when microwave power is added to the oxidizing gas.

Typically, any or all of the chamber lining, distribution manifold 111, susceptor 112, and various other reactor hardware is made out of material such as aluminum or anodized aluminum. An example of such a CVD reactor is described in U.S. Pat. No. 5,000,113, entitled "A Thermal CVD/PECVD Reactor and Use for Thermal Chemical Vapor Deposition of Silicon Dioxide and In-situ Multi-step Planarized Process," issued to Wang et al. and assigned to Applied Materials, Inc., the assignee of the present invention.

The lift motor 114 raises and lowers susceptor 112 between a processing position and a lower, substrate-loading position. The motor, the gas mixing system 119, and the RF power supply 125 are controlled by a system controller 134 over control lines 136. The reactor includes analog assemblies, such as mass flow controllers (MFCs) and standard or pulsed RF generators, that are controlled by the system controller 134 which executes system control software stored in a memory 138, which in the preferred embodiment is a hard disk drive. Motors and optical sensors are used to move and determine the position of movable mechanical assemblies such as the throttle valve of the vacuum pump 132 and motor for positioning the susceptor 112.

The system controller 134 controls all of the activities of the CVD reactor and a preferred embodiment of the controller 134 includes a hard disk drive, a floppy disk drive, and a card rack. The card rack contains a single board computer (SBC), analog and digital input/output boards, interface boards and stepper motor controller boards. The system controller conforms to the Versa Modular Europeans (VME) standard which defines board, card cage, and connector dimensions and types. The VME standard also defines the bus structure having a 16-bit data but and 24-bit address bus.

The system controller 134 operates under the control of a computer program stored on the hard disk drive 138. The computer program dictates the timing, mixture of gases, RF power levels, susceptor position, and other parameters of a particular process. The above CVD system description is mainly for illustrative purposes, and other plasma CVD equipment such as electrode cyclotron resonance (ECR) plasma CVD devices, induction-coupled RF high density plasma CVD devices, or the like may be employed. Additionally, variations of the above described system such as variations in susceptor design, heater design, location of RF power connections and others are possible. For example, the substrate could be supported and heated by a resistively heated susceptor. The pretreatment and method for forming a pretreated layer of the present invention is not limited to any specific apparatus or to any specific plasma excitation method.

Feature Formation

Generally, a feature, such as a dual damascene structure, is formed by depositing dielectric material on the surface of a substrate, etching the dielectric material to form a feature definition, filling at least a portion of the feature definition with conductive material to form the feature, planarizing the feature, removing at least a portion of the dielectric material in which the feature is formed, and then depositing a low k dielectric material on the substrate surface. The dielectric material may comprise one or more dielectric layers. The feature formed is preferably a dual damascene structure. The low k dielectric layer is preferably deposited to cover the dual damascene structure and to fill in gaps and voids formed during the dielectric material removal process, such as by a gap fill process.

While the following description detailed herein is directed to the formation of dual damascene feature on a substrate, other features, such as vias, lines, contacts, and other features known in the am, may be formed by the processes described herein.

Figure 2:
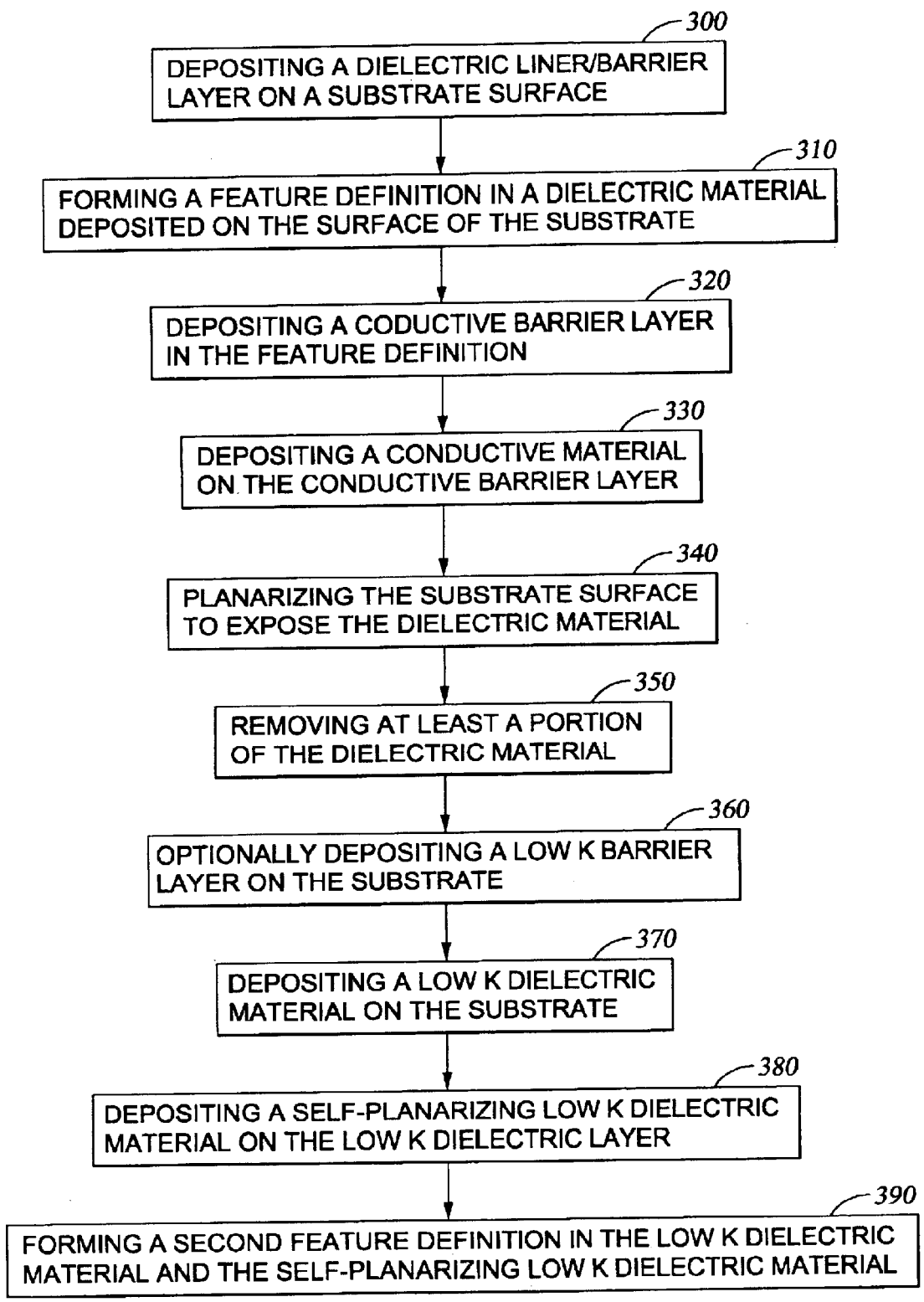
FIG. 2 is a flow chart illustrating steps is a flow chart illustrating steps of one embodiment in forming a dual damascene structure.

FIG. 2 is a flow chart illustrating steps of one embodiment of the invention in forming a dual damascene structure. The flow chart is provided for illustrative purposes and should not be construed as limiting the scope of the invention. A dielectric liner/barrier layer is typically first deposited upon the substrate surface to prevent diffusion of subsequently deposited material, such as copper, into the substrate at step 300. The dielectric liner/barrier layer preferably comprises a low k material and can perform as an etch stop to protect the substrate during etching and removal of subsequently deposited layers.

A feature definition is then formed on the dielectric liner/barrier layer at step 310. The feature definition is generally formed by depositing dielectric material on the barrier layer and etching the definition therein. The deposited dielectric material may be deposited in one or more layers of dielectric material with one or more etch stop or barrier layers of dielectric material disposed therein to help form and define the dual damascene definition. The dual damascene definition is etched in the dielectric material by conventional means and processes known in the art and may be performed in one or more steps. For example, to form a dual damascene definition, the dielectric material can be etched to form vertical interconnects, such as vias/contacts, and then etched to form horizontal interconnects, such as lines/trenches. Alternatively, both horizontal and vertical interconnects may be formed in a single etching process.

One process for forming a dual damascene definition is a "self-aligning contact" (SAC) scheme in which an etch stop layer of a dielectric material is deposited on a first dielectric layer and etched to define vertical interconnects, such as vias/contacts, and to expose the underlying first dielectric layer before a second dielectric layer is deposited. The vertical and horizontal interconnects are then etched in a single step in the first and second dielectric layers to form the dual damascene definition. Alternatively, in a "counter-bore" scheme, a series of dielectric layers are deposited on a substrate. Then vertical interconnects such as vias/contacts are etched through all of the layers and horizontal interconnects such as lines/trenches are etched through the top layers. In the alternative, the lines/trenches are etched in the top layers and then the vias/contacts are etched through the bottom layers.

A conductive barrier layer is then deposited on the substrate surface and on the exposed surfaces of the dual damascene definition at step 320. The conductive barrier layer is deposited to prevent diffusion of subsequently deposited materials, such as copper, into the surrounding dielectric material and to provide adhesion between the subsequently deposited materials and the substrate. The conductive barrier layer is confomally deposited over the surfaces of the dual damascene definition and may be deposited by a chemical vapor deposition (CVD) technique, a physical deposition (PVD) technique, such as ionized metal plasma (IMP) PVD, or any other process conventionally known in the art.

Thereafter, a layer of conductive material is deposited on the conductive barrier layer to fill at least a portion of the dual damascene definition at step 330. The conductive material is deposited using either a CVD technique, a PVD technique, such as ionized metal plasma (IMP) PVD, an electrochemical deposition technique, such as electroplating, or other means known in the art to fill at least a portion of the definition to form the conductive structure.

After the conductive material has been deposited, the substrate surface is planarized at step 340 using chemical mechanical polishing or other planarizing methods known in the art to expose the underlying dielectric material and form the dual damascene structures.

After planarizing the substrate surface, at least a portion of the deposited dielectric material is removed from the surface of the substrate at step 350. Substantially all of the dielectric material between dual damascene structures or the dielectric material surrounding a dual damascene structure may be removed to the low k barrier layer. Alternatively, a portion of the dielectric material between dual damascene structures or surrounding a dual damascene structure is removed, such as the dielectric material adjacent the horizontal interconnects of the dual damascene structures. The dielectric material may be removed by a etching means or process known in the art and may be performed in one or more steps. Additionally, the invention contemplates removal of the dielectric material by other processes suitable for removing dielectric materials known in the art, such as chemical mechanical polishing.

A low k dielectric barrier may be optionally deposited on the substrate surface at step 360 to prevent conductive material from diffusing into subsequently deposited materials.

A low k dielectric material is deposited in a gap fill process on the substrate surface at step 370. Generally, the low k gap fill is deposited to sufficient depth to cover the remaining dual damascene structures formed on the substrate surface. The low k gap fill layer can then be planarized to expose the dual damascene structure.

Alternatively, a second dielectric material may be deposited on the low k dielectric material at step 380 for formation of subsequent semiconductor devices and structures including additional dual damascene definitions. The second dielectric material preferably comprises a self-planarizing material, such as a self-planarizing oxide layer. A second dual damascene definition may then be etched into the planarized second dielectric material and portions of the low k dielectric material. The dual damascene definition is preferably etched and filled at step 390 in the same or similar manner as described above in steps 310 to 340.

FIGS. 3A through 3H further illustrate the process of one embodiment of the invention described herein. Referring to FIG. 3A to 3H, generally, an aperture 406, such as a dual damascene definition, is formed in dielectric material 404 deposited on a substrate barrier layer 402. The substrate barrier layer 402 is preferably a low k dielectric material conformally deposited on the substrate 400 to prevent interlayer diffusion of materials into the substrate 400. The aperture 406 may be etched by means conventionally known in the art in the dielectric material 404. Optionally, the substrate may then be exposed to a reactive pre-clean process to remove contaminants, particulate matter, and oxides that may, have formed on the exposed portions of the aperture. A conductive barrier layer 408 is deposited on exposed surfaces of the aperture 406, and a conductive material 410 is subsequently deposited on the conductive barrier layer 408. The substrate 400 may then be planarized using a chemical mechanical polishing process to form a feature 413 thereon.

At least a portion of the dielectric material 404 is then removed from the substrate 400. A low k barrier layer 412 is conformally deposited over the feature 413 and substrate barrier layer 402. During the dielectric removal process, the low k barrier layer 402 acts as an etch stop on the substrate surface during removal of the dielectric layer 404. A low k gap fill layer 414 is deposited over the feature 413, with the low k gap fill 414 deposited to at least substantially cover the feature 413. A planarizing dielectric layer 416 is then deposited on the low k gap fill 414. The dielectric layers 414 and 416 are then etched as aperture 404 to form apertures 418. A barrier layer 420 and conductive material 422 are then deposited respectively in aperture 418 and planarized to expose the underlying dielectric layer 404 and to form feature 423.

Figure 3A:
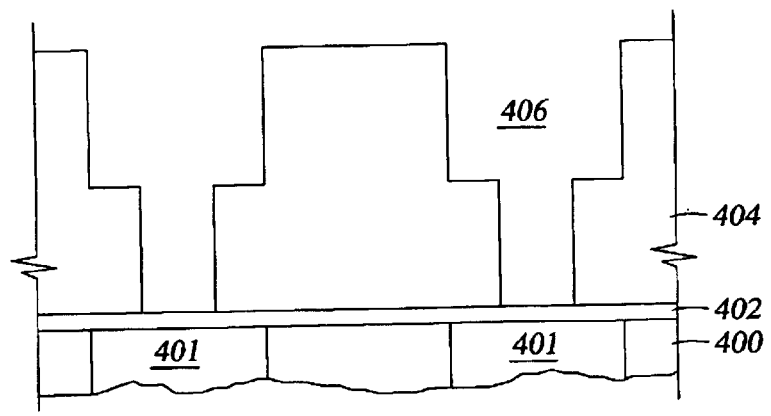
FIGS. 3A to 3I are schematic diagrams of one embodiment of a process for, fabricating a dual damascene structure.

Referring to FIG. 3A, the aperture 406 is formed by depositing and pattern etching one or more dielectric layers 404 on the low k barrier layer 402 conformally deposited on the substrate 400. The term aperture is broadly defined in accordance with its customary usage in the semiconductor industry and is more particularly defined herein as a definition of a substrate structure formed in a substrate material or materials deposited on a substrate, and includes, but is not limited to, such substrate structures as trench, lines, vias, contact, interconnects and dual damascenes. As shown in FIG. 3A, the aperture 406 is a dual damascene definition.

Substrate 400 comprises a doped silicon substrate or material such as glass, thermal oxide, quartz or other materials conventionally used in semiconductor fabrication. The substrate 400 may also comprise a pattern substrate having dielectric layers and conductive layers, such as conductive lines 401, which can include a series of underlined layers interconnects with various materials. The substrate barrier layer 402 comprises a low k material, such as silicon nitride, silicon oxycarbide, amorphous hydrogenated silicon carbide (BLOk™), or other low k material known in the art. Preferably silicon nitride or amorphous hydrogenated silicon carbide is used as the substrate barrier layer 402. The amorphous hydrogenated silicon carbide (BLOk™) and process for deposition such materials is more fully described in co-pending U.S. patent application Ser. No. 09/165,248, entitled, "A Silicon Carbide Deposition For Use As A Barrier layer and An Etch Stop," filed on Oct. 1, 1998, and incorporated herein by reference to the extent not inconsistent with the invention. The substrate barrier layer 402 can also act as an etch stop to protect the substrate during etching and removal of subsequent layers that may be deposited thereon.

The dielectric layer 404 may be of any dielectric material whether presently known or yet to be discovered as within the scope of the invention known in the art. The dielectric material may be deposited by conventional methods known in the art, such as by chemical vapor deposition (CVD) techniques. The dielectric layer preferably comprises silicon oxide deposited by a plasma enhanced chemical vapor deposition (PECVD) process, such as the plasma enhanced deposition of silane or tetraethylorthosililate (TEOS), in the DxZ™ CVD processing chamber described above.

An exemplary processing regime for depositing a silicon dioxide film is as follows. The silicon dioxide layer is deposited by introducing a silane gas at a flow rate between about 20 sccm and about 400 sccm, introducing nitrous oxide at a flow rate between about 500 sccm and about 4,000 sccm into the processing chamber, and generating a plasma by supplying a power level between about 100 watts and about 1000 watts to a gas distribution manifold to deposit the silicon nitride film.

During the deposition process, the processing chamber is maintained at a pressure of about 0.1 Torr or greater, and the substrate is maintained at a temperature of about 450° C. or below. The processing chamber is preferably maintained at a pressure between about 0.1 Torr and about 12 Torr. The substrate is preferably maintained at a temperature between about 200° C. and about 450° C. The gas distribution manifold is generally spaced from the substrate by a distance between about 200 mils and about 800 mils (thousandths of an inch), or a distance between about 5 mm and about 20 mm.

The dielectric layer 404 may then be etched with any dielectric etching or polishing process known in the art including plasma etching. An example of etching dielectric materials, such as silicon oxide, is more fully described in U.S. Pat. No. 5,843,847, entitled "Method for Etching Dielectric layers with High selectivity and Low Microloading," issued on Dec. 1, 1998, which is assigned to Applied Materials, Inc., and incorporated herein by reference to the extent not inconsistent with the invention.

While not shown, in etching and forming the dual damascene aperture 406, the dielectric layer 404 may comprise multiple layers and further comprise interlayer barrier layers and etch stops disposed therein to help define the aperture 406 formed during the etch process. For example, a first dielectric layer, such as silicon oxide, is deposited on the substrate surface, an etch stop layer of a dielectric material, such as silicon nitride, silicon oxycarbide, or amorphous hydrogenated silicon carbide is deposited on a first dielectric layer and etched to define vertical interconnects, such as vias/contacts, and to expose the underlying first dielectric layer before a second dielectric layer, such as silicon oxide, is deposited. The vertical and horizontal interconnects are then etched in a single step in the first and second dielectric layers to form the aperture 406. The interconnects may be etched through the liner/barrier layer 402 in order to contact underlying metal lines 401.

Optionally, the substrate may then be exposed to a reactive pre-clean process to remove some oxides and other contaminants, such as etch residue and metal contaminants, in the aperture 406 and on the surface of the substrate, which may interfere with subsequent layer deposition. The reactive pre-clean process comprises exposing the substrate surface to a plasma, preferably comprising hydrogen and/or an inert gas, such as argon, at a power density between of 0.03 watts/cm$^2$ and about 3.2 watts/cm$^2$, or at a power level between about 10 watts and 1000 for a 200 millimeter substrate. The processing chamber is maintained at a pressure of about 20 Torr or less and at a substrate temperature of about 450° C. or less during the reactive clean process. The reactive pre-clean described herein can be used to remove oxides formed on metal layers, such as the conductive barrier layers described herein or for copper. The invention contemplates the use of other oxide removal processes, such as nitrogen reduction of oxide formations on metal layers.

Figure 3B:
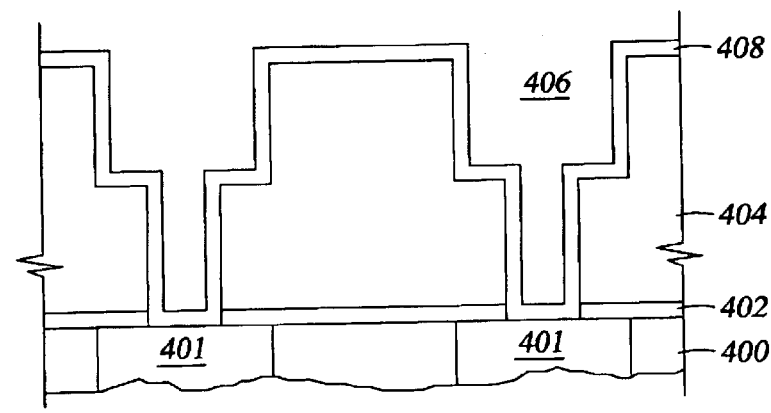

Referring to FIG. 3B, the conductive barrier layer 408 is deposited on the exposed surface of the aperture 406 formed in dielectric layer 404. The conductive barrier layer 408 is deposited upon the exposed surfaces of the aperture 406 to prevent interlayer diffusion, such as copper migration into the surrounding dielectric material, and to improve adhesion layer between the dielectric material 404 and subsequently deposited metal layers. The conductive barrier layer 408 may be formed by the disassociation of an organometallic precursor by a thermal or plasma enhanced chemical vapor deposition process, or alternatively, deposited by a physical vapor deposition process, such as an ionized metal plasma physical vapor deposition process (IMP-PVD). Preferably, the conductive barrier layer 408 comprises materials selected from the group of titanium, titanium nitride, titanium silicon nitride, tungsten nitride, tungsten silicon nitride, tantalum, tantalum nitride, tantalum silicon nitride, and refractory metals such as niobium, vanadium, and nitrides thereof, and combinations thereof.

Figure 3C:
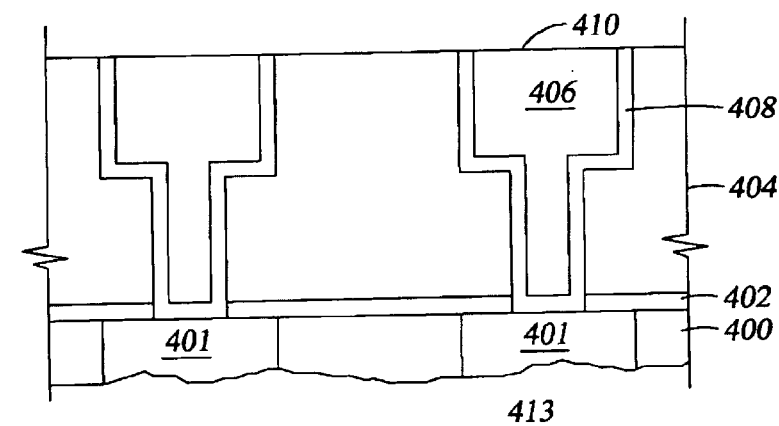

Referring to FIG. 3C, conductive material 410 is deposited on the conductive barrier layer 408. The conductive material 410 is deposited to fill the at least a portion of the aperture 406, and is preferably deposited to fill the aperture 406. Alternatively, the conductive material 410 comprises a seed layer of a conducting metal to fill at least a portion of the aperture 406 and a subsequent metal fill layer on the seed layer.

The conductive material 410 preferably comprises copper or aluminum. The conductive material 410 may be doped with material, such as phosphorous and boron, to improve deposition and fill of the aperture 406. The conductive material 410 may be deposited by a chemical vapor deposition (CVD) technique, a physical deposition (PVD) technique, such as ionized metal plasma (IMP) PVD, electroplating, electroless deposition, evaporation deposition, or any other process conventionally known in the art.

Preferably, the metal layer 410 comprises copper and is deposited using an electroplating technique. An exemplary electroplating method is describing co-pending U.S. patent application Ser. No. 09/114,865, filed on Jul. 13, 1998, and is incorporated herein by reference to the extent not inconsistent with the invention.

The conductive material 410 may also be deposited by a combination of processing regimes. For example, a seed layer may be deposited by chemical vapor deposition and PVD layer may be deposited on top of a CVD metal seed layer, and the PVD metal layer may be deposited at a temperature less than the melting temperature of the material of the conducting metal being deposited which allows reflow of the seed layer and the conducting metal layer to fill the aperture therein. After the conductive material 410 is deposited, the substrate may be annealed to recrystallize the conductive material and remove any voids formed in the aperture 406.

Referring back to FIG. 3C, the aperture 406 may be further processed by planarizing the top portion of the aperture 406 preferably by a chemical mechanical polishing process. During the planarization process portions of the conducting metal layer 410 and the dielectric layer 404 are removed from the top of the structure leaving a planar surface with a conducting feature 413 formed therein.

Figure 3D:
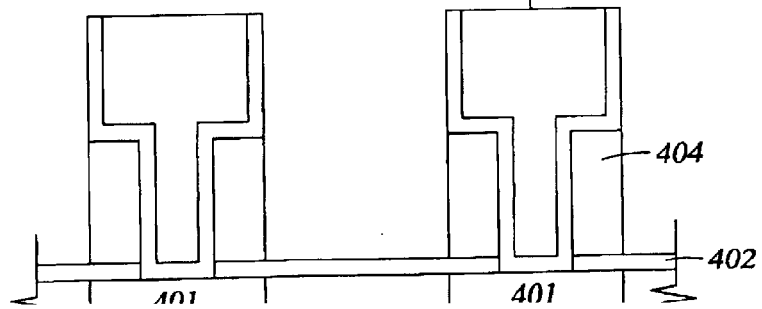

Referring to FIG. 3D, the remaining dielectric material 404 from the aperture etching process is then etched and removed from the substrate surface. A suitable process for removing the remaining dielectric material 404 is more fully described in U.S. Pat. No. 5,843,847, entitled "Method for Etching Dielectric layers with High selectivity and Low Microloading," issued on Dec. 1, 1998, which is assigned to Applied Materials, Inc., and incorporated herein by reference to the extent not inconsistent with the invention. The dual damascene structures formed 413 in the dielectric material 404 acts as a hardmask during the etch process, which allows some dielectric material 404 to be retained in the space located between the substrate and the trench level of the dual damascene structure which surrounds the lower or via portion of the dual damascene structure. The retained dielectric material can act as a diffusion barrier to the conductive material and further insolates subsequently deposited low k material from the conductive material.

Figure 3E:
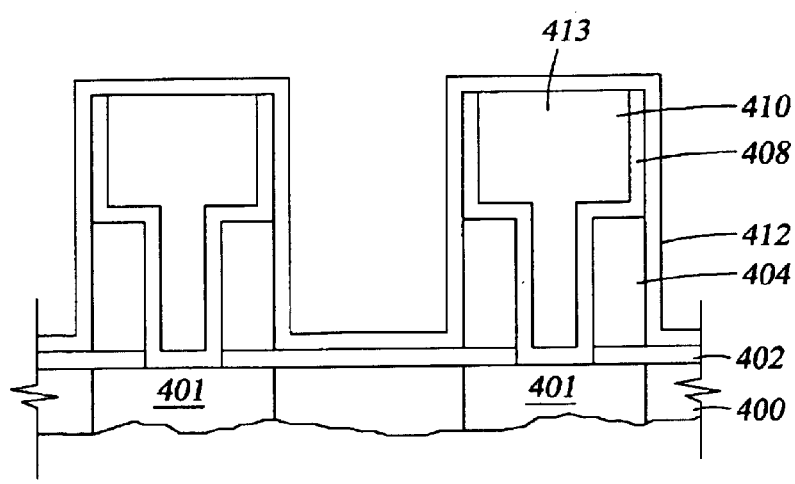

Referring to FIG. 3E, a low k barrier layer 412 may be deposited conformally over the feature 413 and on the substrate 402 to prevent diffusion of the conductive material into the surrounding material. The low k dielectric barrier may comprise silicon nitride, silicon oxycarbide, amorphous hydrogenated silicon carbide (BLOk™), and combinations thereof, and preferably silicon nitride or amorphous hydrogenated silicon carbide are used.

Figure 3F:
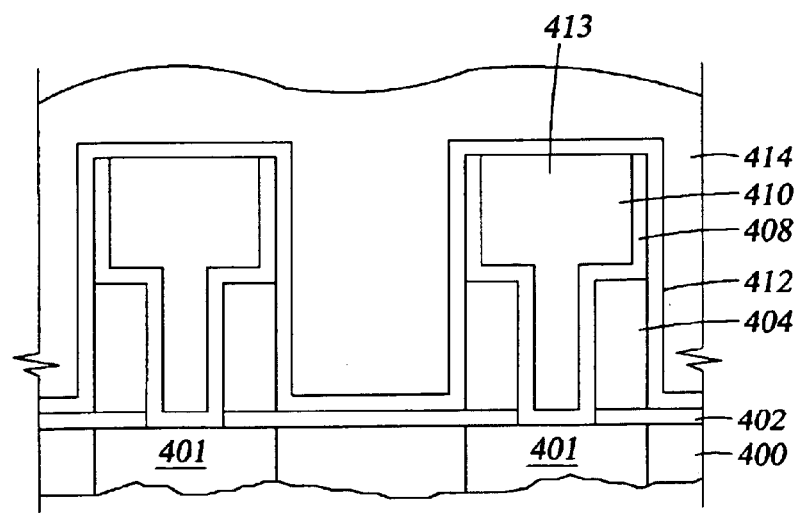

Referring to FIG. 3F a low k gap fill dielectric material 414 may be deposited into the dual damascene structures 413 typically covering the surfaces of the dual damascene structures 413. The low k dielectric material 414 preferably comprises a silicon and carbon containing material, such as silicon oxycarbide, but may comprise silicon carbide, undoped silicon dioxide, also known as undoped silicon glass (USG), fluorine doped silicon glass, (FSG) or other low k dielectric material.

One exemplary processing regime for depositing a low k silicon and carbon containing material as a gap fill comprises introducing a processing gas including trimethylsilane to a processing chamber at a flow rate between about 50 sccm and about 100 sccm, preferably about 175 sccm, introducing an oxidizing gas, such as a mixture of oxygen and between about 6 wt % and about 18 wt % ozone, at a flow rate between about 2500 sccm and about 10000 sccm, preferably at about 5000 sccm, introducing an inert gas, such as helium into the processing chamber at a rate between about 1000 sccm and about 10000 sccm, preferably at about 8000 sccm, maintaining a chamber pressure between about 50 Torr and about 250 Torr, preferably at about 100 Torr, and maintaining a substrate surface temperature between about 50° C. and about 250° C., preferably at about 125° C. The gas distribution plate 11 is spaced between about 180 mils and about 500 mils, preferably at about 210 mils, from the substrate.

Another exemplary low k dielectric material that may be used as a gap fill is a silicon oxide film containing silicon-carbon bonds deposited from organosilane and organosiloxane precursors in a plasma-enhanced CVD process and is disclosed in U.S. Pat. No. 6,054,379, entitled "Method of Depositing a Low K Dielectric With Organosilane," issued on Apr. 25, 2000 and in co-pending U.S. patent application Ser. No. 09/247,381, entitled "Plasma Process For Depositing Dielectric Constant Films," filed on Feb. 10, 1999, both of which are assigned to Applied Materials, Inc., and is incorporated herein by reference to the extent not inconsistent with the invention.

Figure 3G:
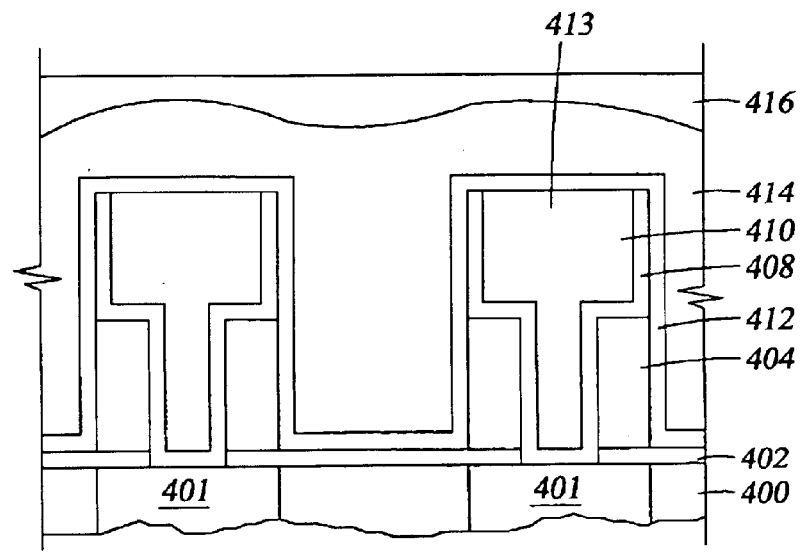

Referring to FIG. 3G a self planarizing dielectric material 416 is deposited upon the low k dielectric material 414. The second dielectric material preferably comprises a self-planarizing PECVD silicon oxide layer such as spin-on polymers or oxides deposited in liquid form, such as by the reaction silane and hydrogen peroxide. The self-planarizing low k dielectric layer is preferably an oxide layer deposited by plasma enhanced chemical vapor deposition. An example of such a planarizing layer is disclosed in co-pending U.S. patent application Ser. No. 09/247,381, entitled "Plasma Process For Depositing Dielectric Constant Films," filed on Feb. 10, 1999, assigned to Applied Materials, Inc., and is incorporated herein by reference to the extent not inconsistent with the invention.

Figure 3H:
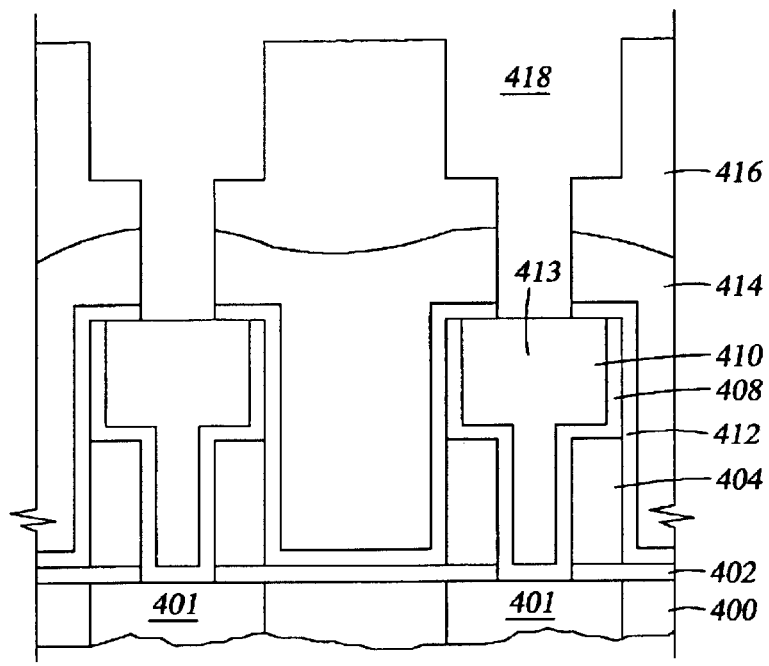
Figure 3I:
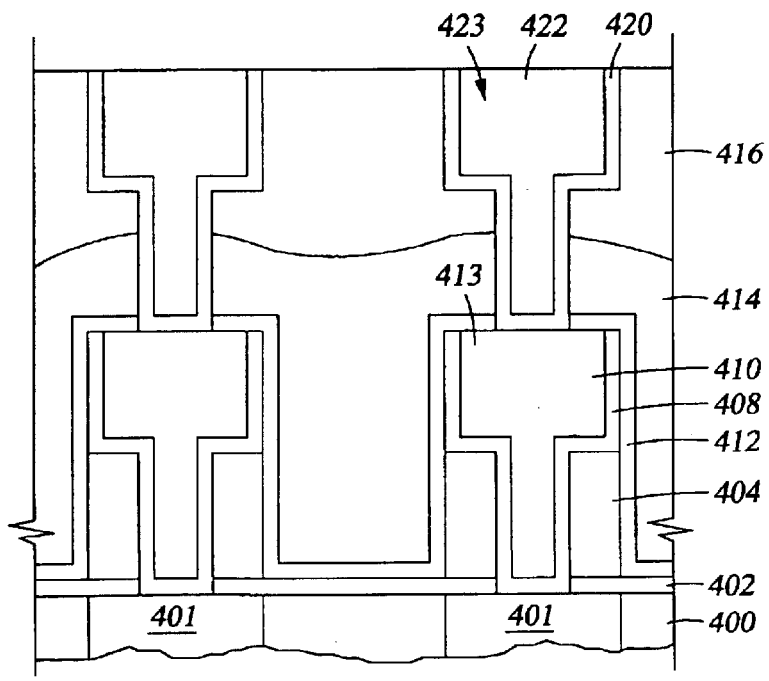

Referring to FIG. 3H, a second aperture 418 may be etched in the low k dielectric material 414, the self-planarizing dielectric material 416, and the low k barrier layer 412. The aperture 418 may be formed by the methods used to form the aperture 406. An example of etching a low k dielectric material is described in co-pending U.S. patent application Ser. No. 09/329,012, entitled, "Integrated Low K Dielectrics And Etch Stops," filed on Jun. 9, 1999, and incorporated herein by reference to the extent not inconsistent with the invention.

After the aperture 418 is formed in the dielectric materials, a barrier layer 420 and a conducting metal layer 422, such as copper, are deposited sequentially in the aperture 418 to form a second feature 423 connected to feature 413. Following fill of the aperture 418, the dual damascene structure is planarized and then annealed to recrystallized the copper forming part of the dual damascene structure. Other subsequent processing of the substrate 400 may be performed including additional deposition of layers etching for a new and substrate of the process on integrated circuit (IC) manufacturing including repetition the process step in the invention described herein.

It is contemplated that removing a silicon oxide layer and then depositing a low k dielectric gap fill layer on a dual damascene structure, low k dual damascene structures with minimized interlayer diffusion can be formed without a chemical mechanical polishing step and without breaking the seal on a vacuum. Eliminating or minimized chemical polishing of the low k dielectric material minimizes the distortion of deposited materials and layers and possible delamination of the low k dielectric material. Without the need to break the vacuum seal, exposure of the substrate to contaminants, such as moisture and oxygen, which can detrimentally affect the dielectric constant and device performance, is minimized.

Further, it is believed that the low k gap fill will allow lower interlevel and interlevel dielectric constants since the use of etch stops or barrier layers, such as silicon nitride, which can detrimentally affect the dielectric constant of the material surrounding the dual damascene, is minimized. Additionally, it is believed that by forming the dual damascene structures in a harder material such as the silicon oxide compared to the low k gap-fill material, dual damascene structures with improved hardness and lower deformation and mechanical stresses can be formed.

While foregoing is directed to the preferred embodiment of the present invention, other and further embodiments of the invention may be devised without departing from the basic scope thereof, and the scope thereof is determined by the claims that follow.

What is claimed is:

1. A method for processing a substrate, comprising:
   (a) forming a feature definition in a dielectric material deposited on a surface of a substrate;
   (b) depositing one or more conductive materials to fill at least a portion of the feature definition;
   (c) planarizing the one or more conductive materials to expose the dielectric material;
   (d) etching at least a portion of the dielectric material exposed by the planarizing the one or more conductive materials; and
   (e) depositing a low k dielectric material to replace the dielectric material removed by the etching at least a portion of the dielectric material.

2. The method of claim 1, wherein planarizing the one or more conductive materials comprises chemical mechanical polishing the one or more conductive materials.

3. The method of claim 1, further comprising planarizing the substrate surface after depositing the low k dielectric layer.

4. The method of claim 1, wherein removing at least a portion of the dielectric material comprises etching substantially all the dielectric material to the substrate surface.

5. The method of claim 1, wherein depositing the low k dielectric material comprises introducing a processing gas including trimethylsilane to a processing chamber at a flow rate between about 50 sccm and about 1000 sccm, introducing an oxidizing gas at a flow rate between about 2500 sccm and about 10000 sccm, introducing an inert gas into the processing chamber at a rate between about 1000 sccm and about 10000 sccm, maintaining a chamber pressure between about 50 Torr and about 200 Torr, and maintaining a substrate surface temperature between about 50° C. and about 250° C.

6. The method of claim 1, wherein depositing the low k dielectric material comprises introducing a processing gas including trimethylsilane to a processing chamber at a flow rate of about 175 sccm, introducing an oxidizing gas at a flow rate of about 5000 sccm, introducing an inert gas into the processing chamber at a rate of about 8000 sccm, maintaining a chamber pressure of about 100 Torr, and maintaining a substrate surface temperature of about 125° C.

7. The method of claim 1, wherein forming a feature definition in a dielectric material comprises:
  (a) depositing a first dielectric material;
  (b) depositing a second dielectric material on the first dielectric material;
  (c) etching the second dielectric layer to exposed a portion of the first dielectric layer;
  (d) depositing a third dielectric layer on the second dielectric material and exposed portion of the first dielectric layer; and
  (e) etching the first and third dielectric layers to form a vertical interconnect and to form a horizontal interconnect.

8. The method of claim 7, wherein removing at least a portion of the dielectric material comprises etching the dielectric material adjacent the horizontal interconnect.

9. The method of claim 1, further comprising depositing a low k barrier layer on the surface of the substrate prior to depositing the dielectric material.

10. The method of claim 9, wherein the low k barrier layer deposited on the surface of the substrat comprises a low k material selected from the group of silicon nitride, silicon oxycarbide, amorphous hydrogenated silicon carbide, and combinations thereof.

11. The method of claim 1, wherein the low k dielectric material comprises a silicon and carbon containing material.

12. The method of claim 11, wherein the low k dielectric material has a dielectric constant of about 4.0 or less.

13. The method of claim 1, further comprising depositing a low k barrier layer prior to depositing the low k dielectric material.

14. The method of claim 13, wherein the low k barrier layer deposited prior to depositing the low k dielectric material comprises a low k material selected from the group of silicon nitride, silicon oxycarbide, amorphous hydrogenated silicon carbide, and combinations thereof.

15. The method of claim 1, wherein depositing the one or more conductive materials comprises depositing a conductive barrier layer of a first conductive material and then depositing a second conductive material on the conductive barrier layer.

16. The method of claim 15, wherein the first conductive material and the second conductive material are deposited by chemical vapor deposition, physical vapor deposition, or an electrochemical deposition technique.

17. The method of claim 15, wherein the first conductive material comprises one or more materials selected from the group of titanium, titanium nitride, titanium silicon nitride, tungsten, tungsten nitride, tungsten silicon nitride, tantalum, tantalum nitride, tantalum silicon nitride, and combinations thereof.

18. The method of claim 15, wherein the second conductive material is selected from the group of copper, doped copper, aluminum, doped aluminum, and combinations thereof.

19. The method of claim 1, wherein forming a feature definition in a dielectric material comprises:
  (a) depositing a first dielectric material;
  (b) depositing a second dielectric material on the first dielectric material;
  (c) depositing a third dielectric layer on the second dielectric material;
  (d) etching the first, second, and third dielectric layers to form a vertical interconnect; and
  (e) etching the third dielectric layer to form a horizontal interconnect.

20. The method of claim 19, wherein the first and third dielectric layers comprises silicon oxide.

21. The method of claim 19, wherein the first and third dielectric layers comprises silicon oxide.

22. The method of claim 19, wherein the second dielectric layer is an etch stop.

23. The method of claim 19, wherein removing at least a portion of the dielectric material comprises etching the dielectric material adjacent the horizontal interconnect.

24. The method of claim 19, wherein the second dielectric layer is an etch stop.

25. The method of claim 24, wherein the second dielectric layer comprise silicon nitride, silicon oxycarbide, amorphous hydrogenated silicon carbide, and combinations thereof.

26. The method of claim 24, wherein the second dielectric layer comprise silicon nitride, silicon oxycarbide, amorphous hydrogenated silicon carbide, and combinations thereof.

27. A method for forming a dual damascene interconnect, comprising:
  (a) depositing one or more dielectric layers on a substrate;
  (b) etching the one or more dielectric layers to form a dual damascene definition therein, the dual damascene definition having a vertical interconnect and a horizontal interconnect;
  (c) depositing a conductive barrier layer over exposed surfaces of the dual damascene definition;
  (d) depositing a conductive material over the conductive barrier layer to fill at least a portion of the dual damascene definition;
  (e) planarizing the conductive barrier layer and the conductive material to expose the one or more dielectric layers;
  (f) etching at least a portion of the one or more dielectric layers exposed by the planarizing the conductive barrier layer and the conductive material;
  (g) depositing a low k dielectric material to replace the one or more dielectric layers removed by the etching at least a portion of the one or more dielectric layers; and
  (h) depositing a self-planarizing dielectric layer on the low k dielectric material.

28. The method of claim 27, wherein the one or more dielectric layers comprise silicon oxide, silicon nitride, silicon oxycarbide, amorphous hydrogenated silicon carbide, and combinations thereof.

29. The method of claim 27, wherein the conductive barrier layer comprises a material selected from the group of titanium, titanium nitride, titanium silicon nitride, tungsten, tungsten nitride, tungsten silicon nitride, tantalum, tantalum nitride, tantalum silicon nitride, and combinations thereof.

30. The method of claim 27, wherein the conductive material is selected from the group of copper, doped copper, aluminum, doped aluminum, and combinations thereof.

31. The method of claim 27, wherein removing at least a portion of the dielectric material comprises etching substantially all the dielectric material to the substrate surface.

32. The method of claim 27, wherein removing at least a portion of the dielectric material comprises etching the dielectric material adjacent the horizontal interconnect.

33. The method of claim 27, wherein etching the one or more dielectric layers comprises etching the first and second dielectric layers to form a vertical interconnect and etching the third dielectric layer to form a horizontal interconnect.

34. The method of claim 27, further comprising performing a chemical mechanical polishing process on the substrate.

35. The method of claim 27, wherein depositing the low k dielectric material comprises introducing a processing gas including trimethylsilane to a processing chamber at a flow rate between about 50 sccm and about 1000 sccm, introducing an oxidizing gas at a flow rate between about 2500 sccm and about 10000 sccm, introducing an inert gas into the processing chamber at a rate between about 1000 sccm and about 10000 sccm, maintaining a chamber pressure between about 50 Torr and about 200 Torr, and maintaining a substrate surface temperature between about 50° C. and about 250° C.

36. The method of claim 27, wherein depositing the low k dielectric material comprises introducing a processing gas including trimethylsilane to a processing chamber at a flow rate of about 175 sccm, introducing an oxidizing gas at a flow rate of about 5000 sccm, introducing an inert gas into the processing chamber at a rate of about 8000 sccm, maintaining a chamber pressure of about 100 Torr, and maintaining a substrate surface temperature of about 125° C.

37. The method of claim 27, further comprising etching the low k dielectric material and the self-planarizing dielectric layer to form a dual damascene definition.

38. The method of claim 37, further comprising repeating steps (c) through (e).

39. The method of claim 27, wherein the low k dielectric material comprises a silicon and carbon containing material.

40. The method of claim 39, wherein the low k dielectric material has a dielectric constant of about 4.0 or less.

41. The method of claim 27, further comprising depositing a low k barrier layer prior to depositing the dielectric material.

42. The method of claim 41, wherein the low k barrier layer deposited on the surface of the substrate comprises a low k material selected from the group of silicon nitride, silicon oxycarbide, amorphous hydrogenated silicon carbide, and combinations thereof.

43. The method of claim 27, further comprising depositing a low k barrier layer prior to depositing a low k dielectric material.

44. The method of claim 43, wherein the low k barrier layer deposited prior to depositing the low k dielectric material comprises a low k material selected from the group of silicon nitride, silicon oxycarbide, amorphous hydrogenated silicon carbide, and combinations thereof.

45. A method for forming a dual damascene interconnect, comprising:

(a) depositing a first dielectric material;

(b) depositing a second dielectric material on the first dielectric material;

(c) etching the second dielectric layer to exposed a portion of the first dielectric layer;

(d) depositing a third dielectric layer on the second dielectric material and exposed portion of the first dielectric layer;

(e) etching the first and third dielectric layers to form a vertical interconnect and a horizontal interconnect of a dual damascene definition;

(f) depositing a conductive barrier layer over exposed surfaces of the dual damascene definition;

(g) depositing a conductive material over the conductive barrier layer to fill at least a portion of the dual damascene definition;

(h) planarizing the conductive barrier layer and the conductive material to expose the one or more dielectric layers;

(i) etching the one or more dielectric layers exposed by the planarizing the conductive barrier layer and the conductive material;

(j) depositing a low k dielectric material on the substrate to replace the one or more dielectric layers removed by the etching at least a portion of the one or more dielectric layers; and (k) depositing a self-planarizing dielectric layer on the low k dielectric material.

46. The method of claim 45, further comprising etching the low k dielectric material and the self-planarizing dielectric layer to form a dual damascene definition.

47. The method of claim 45, further comprising repeating steps (f) through (h).

48. The method of claim 45, wherein the first and third dielectric layers comprises silicon oxide.

49. The method of claim 45, wherein the second dielectric layer is an etch stop.

50. The method of claim 45, wherein the second dielectric layer comprise silicon nitride, silicon oxycarbide, amorphous hydrogenated silicon carbide, and combinations thereof.

51. The method of claim 45, wherein removing at least a portion of the dielectric material comprises etching substantially all the dielectric material to the substrate surface.

52. The method of claim 45, wherein removing at least a portion of the dielectric material comprises etching the dielectric material adjacent the horizontal interconnect.

53. The method of claim 45, wherein the conductive barrier layer comprises a material selected from the group of titanium, titanium nitride, titanium silicon nitride, tungsten, tungsten nitride, tungsten silicon nitride, tantalum, tantalum nitride, tantalum silicon nitride, and combinations thereof.

54. The method of claim 45, wherein the conductive material is selected from the group of copper, doped copper, aluminum, doped aluminum, and combinations thereof.

55. The method of claim 45, wherein the low k dielectric material comprises a silicon and carbon containing material.

56. The method of claim 45, wherein the low k dielectric material has a dielectric constant of about 4.0 or less.

57. The method of claim 45, wherein depositing the low k dielectric material comprises introducing a processing gas including trimethylsilane to a processing chamber at a flow rate between about 50 sccm and about 1000 sccm, introducing an oxidizing gas at a flow rate between about 2500 sccm and about 10000 sccm, introducing an inert gas into the processing chamber at a rate between about 1000 sccm and about 10000 sccm, maintaining a chamber pressure between about 50 Torr and about 200 Torr, and maintaining a substrate surface temperature between about 50° C. and about 250° C.

58. The method of claim 45, wherein depositing the low k dielectric material comprises introducing a processing gas including trimethylsilane to a processing chamber at a flow rate of about 175 sccm, introducing an oxidizing gas at a flow rate of about 5000 sccm, introducing an inert gas into the processing chamber at a rate of about 8000 sccm, maintaining a chamber pressure of about 100 Torr, and maintaining a substrate surface temperature of about 125° C.

59. The method of claim 45, further comprising depositing a low k barrier layer prior to depositing a low k dielectric material.

60. The method of claim 59, wherein the low k barrier layer deposited prior to depositing the low k dielectric material comprises a low k material selected from the group of silicon nitride, silicon oxycarbide, amorphous hydrogenated silicon carbide, and combinations thereof.

* * * * *

UNITED STATES PATENT AND TRADEMARK OFFICE
CERTIFICATE OF CORRECTION

PATENT NO. : 6,753,258 B1
APPLICATION NO. : 09/706298
DATED : June 22, 2004
INVENTOR(S) : Frederic Gaillard et al.

It is certified that error appears in the above-identified patent and that said Letters Patent is hereby corrected as shown below:

Column 1, Line 60: Insert a period after "art"

Column 2, Line 66: Change "exposed" to --expose--

Column 3, Line 30: Delete "is a flow chart illustrating steps"

Column 3, Line 34: Delete the comma after "for"

Column 3, Line 51: Change "for" to --from--

Column 3, Line 54: Delete the period after "Applied"

Column 5, Line 24: Change "but" to --bus--

Column 5, Line 61: Change "am" to --art--

Column 6, Line 46: Change "confomally" to --conformally--

Column 7, Line 8: Change "a" to --an--

Column 7, Line 46: Delete the comma after "may"

Column 8, Line 25: After "deposition", insert --of--

Column 9, Line 31: After "1000", insert --watts--

UNITED STATES PATENT AND TRADEMARK OFFICE
CERTIFICATE OF CORRECTION

PATENT NO.        : 6,753,258 B1
APPLICATION NO. : 09/706298
DATED             : June 22, 2004
INVENTOR(S)       : Frederic Gaillard et al.

It is certified that error appears in the above-identified patent and that said Letters Patent is hereby corrected as shown below:

Column 11, Line 31: Change "is" to --are--

Column 12, Line 17: Change the first instance of "interlevel" to --intralevel--

Column 13, Claim 7, Line 12: Change "exposed" to --expose--

Column 13, Claim 10, Line 28: Change "substrat" to --substrate--

Column 15, Claim 45, Line 58: Change "exposed" to --expose--

Signed and Sealed this

Twenty-sixth Day of September, 2006

JON W. DUDAS
*Director of the United States Patent and Trademark Office*